United States Patent
Youn et al.

(10) Patent No.: US 11,334,117 B2
(45) Date of Patent: May 17, 2022

(54) FOLDABLE DISPLAY DEVICE

(71) Applicant: LG Display Co., Ltd., Seoul (KR)

(72) Inventors: Yeoo Youn, Paju-si (KR); JeongBeom Park, Gunpo-si (KR)

(73) Assignee: LG Display Co., Ltd., Seoul (KR)

(*) Notice: Subject to any disclaimer, the term of this patent is extended or adjusted under 35 U.S.C. 154(b) by 147 days.

(21) Appl. No.: 16/688,931

(22) Filed: Nov. 19, 2019

(65) Prior Publication Data
US 2020/0183457 A1    Jun. 11, 2020

(30) Foreign Application Priority Data
Dec. 7, 2018  (KR) .................. 10-2018-0157274

(51) Int. Cl.
*G06F 1/16* (2006.01)
*G09F 9/30* (2006.01)
*H01L 51/00* (2006.01)

(52) U.S. Cl.
CPC .......... *G06F 1/1652* (2013.01); *G06F 1/1626* (2013.01); *G06F 1/1681* (2013.01); *G09F 9/301* (2013.01); *H01L 51/0097* (2013.01)

(58) Field of Classification Search
CPC .... G06F 1/1652; G06F 1/1681; G06F 1/1626; G06F 1/1641; G09F 9/301; H01L 51/0097; H01L 2251/5338; Y02E 10/549
See application file for complete search history.

(56) References Cited

U.S. PATENT DOCUMENTS

| | | | |
|---|---|---|---|
| 10,317,578 B2* | 6/2019 | Sarma | G06F 3/041 |
| 2002/0122257 A1* | 9/2002 | Suga | G02B 5/0268 359/580 |
| 2006/0132945 A1* | 6/2006 | Sano | B29C 43/3697 359/883 |
| 2009/0122577 A1* | 5/2009 | Wu | G02B 5/0278 362/627 |
| 2010/0033818 A1* | 2/2010 | Petcavich | B08B 17/06 359/507 |
| 2014/0030517 A1 | 1/2014 | Jo | |
| 2016/0155967 A1* | 6/2016 | Lee | H01L 27/323 257/88 |
| 2017/0010715 A1* | 1/2017 | Lee | G06F 3/044 |
| 2018/0321708 A1* | 11/2018 | Wu | G06F 3/044 |
| 2019/0278086 A1* | 9/2019 | Ofir | G02B 6/122 |

FOREIGN PATENT DOCUMENTS

| | | | |
|---|---|---|---|
| KR | 10-2014-0048863 A | 4/2014 | |
| KR | 10-2015-0027688 A | 3/2015 | |

* cited by examiner

*Primary Examiner* — Jinhee J Lee
*Assistant Examiner* — Christopher L Augustin
(74) *Attorney, Agent, or Firm* — Fenwick & West LLP

(57) ABSTRACT

In a foldable display device according to an embodiment, a groove with a zigzag pattern is formed on a surface of an optical element. The optical element is bonded using an adhesive layer having a low modulus to mitigate stress and impact due to folding in a folding area of the device.
According to an embodiment, a foldable display device includes: a panel assembly divided into a folding area and a non-folding area; and an optical element on the panel assembly including grooves with a zigzag pattern patterned on an upper surface of the optical element.

26 Claims, 11 Drawing Sheets

| CLASSIFICATION | | | 1 | 2 | 3 | 4 | 5 | 6 | 7 | 8 | 9 | 10 | 11 | 12 |
|---|---|---|---|---|---|---|---|---|---|---|---|---|---|---|
| FILM | TENSILE ELASTIC MODULUS | Gpa | 0.8 | 0.8 | 0.8 | 4.5 | 4.5 | 4.5 | 0.5 | 0.5 | 0.5 | 6.5 | 6.5 | 6.5 |
| | THICKNESS | μm | 75 | 100 | 125 | 75 | 100 | 125 | 75 | 100 | 125 | 75 | 100 | 125 |
| OCA | THICKNESS | μm | 25 | 25 | 25 | 25 | 25 | 25 | 25 | 25 | 25 | 25 | 25 | 25 |
| OPTICAL TRANSPARENCY | TRANSMITTANCE | % | 92 | 92 | 92 | 92 | 92 | 92 | 92 | 92 | 92 | 92 | 92 | 92 |
| | Haze | % | 0.8 | 0.8 | 0.8 | 0.8 | 0.8 | 0.8 | 0.8 | 0.8 | 0.8 | 0.8 | 0.8 | 0.8 |
| Foldability | ROOM TEMPERATURE Dynamic | NUMBER OF TIMES | 50K | 50K | 50K | 50K | 50K | 50K | 50K | 50K | 50K | 10K | 5K | 5K |
| | HIGH TEMPERATURE/ HIGH HUMIDITY Static | DAY | 1 | 1 | 1 | 1 | 1 | 1 | 1 | 1 | 1 | 0.5 | 0.5 | 0.5 |
| | HD CRACK | DAY | NONE | NONE | NONE | NONE | NONE | NONE | YES | YES | YES | YES | YES | YES |
| IMPACT RESISTANCE | Ball-drop | 22g steel | 5cm | 7cm | 9cm | 13cm | 15cm | 17cm | 1cm | 2cm | 2cm | 18cm | 20cm | 21cm |
| | Pen-drop | 22.6 Metal tip | 5cm | 10cm | 10cm | 10cm | 11cm | 13cm | 1cm | 2cm | 3cm | 15cm | 17cm | 18cm |

FIG. 8

| CLASSIFICATION | | | 1 | 2 | 3 | 4 | 5 | 6 | 7 | 8 | 9 |
|---|---|---|---|---|---|---|---|---|---|---|---|
| FILM | TENSILE ELASTIC MODULUS | Gpa | 4.5 | 4.5 | 4.5 | 4.5 | 4.5 | 4.5 | 4.5 | 4.5 | 4.5 |
| | THICKNESS | μm | 125 | 125 | 125 | 125 | 125 | 125 | 125 | 125 | 125 |
| OCA | THICKNESS | μm | 25 | 30 | 35 | 40 | 10 | 15 | 20 | 45 | 50 |
| | ADHESIVENESS | gf/in | 20 | 20 | 20 | 20 | 20 | 20 | 20 | 20 | 20 |
| Foldability | ROOM TEMPERATURE Dynamic | NUMBER OF TIMES | 50K | 50K | 50K | 50K | 30K | 34K | 45K | 55K | 60K |
| | HIGH TEMPERATURE/ HIGH HUMIDITY Static | DAY | 1 | 1 | 1 | 1 | 0.5 | 0.5 | 1 | 1 | 1 |
| Indentation | | | GOOD | GOOD | GOOD | GOOD | GOOD | GOOD | GOOD | DEFECT | DEFECT |
| HD CRACK | | | NONE | NONE | NONE | NONE | NONE | NONE | NONE | NONE | NONE |
| IMPACT RESISTANCE | Ball-drop | 22g steel | 17cm | 19cm | 21cm | 13cm | 15cm | 17cm | 17cm | 18cm | 18cm |
| | Pen-drop | 22.6 metal | 13cm | 15cm | 17cm | 18cm | 10cm | 11cm | 12cm | 18cm | 19cm |

FIG. 9

FOLDABLE DISPLAY DEVICE

CROSS-REFERENCE TO RELATED APPLICATIONS

This application claims priority to Republic of Korea Patent Application No. 10-2018-0157274, filed on Dec. 7, 2018, which is incorporated herein by reference for all purposes as if fully set forth herein.

BACKGROUND

Field

The present disclosure relates to a foldable display device.

Description of the Related Art

An image display device that implements various information on a screen is a core technology in an information communication era and is developing to be thinner, lighter, more portable, and have higher performance. Therefore, an organic light emitting display device that displays images through an organic light emitting diode is getting the spotlight.

The organic light emitting diode is a self-emitting device using a thin light emitting layer between two electrodes so that it is advantageous to be manufactured to be thin. The organic light emitting display device has a structure in which a driving circuit and an organic light emitting diode are formed on a substrate and displays images using light emitted from the organic light emitting diode.

Since the organic light emitting display device may be implemented without having a separate light source, it is easy to be applicable to a flexible display device.

When the organic light emitting display device is implemented as a flexible display device, studies are being conducted to develop the organic light emitting display device as a foldable display device in which several parts of the display device can be bent.

SUMMARY

In various embodiments, when a cover window of a foldable display device is formed of a glass, an optical element can protect a user from scattering of fragments due to external impact or stress. Further, an optical element having various function without increasing an overall thickness of the foldable display device can be advantageous and provide a solution of the above-mentioned problem.

Embodiments of the present disclosure include a foldable display device including an optical element having various functions without increasing the overall thickness.

An object to be achieved by the present disclosure is to provide a foldable display device capable of minimizing or reducing a stress and an impact due to the folding.

A replaceable adhesive layer having a high adhesiveness may be disposed between the optical element and the cover window.

An object to be achieved by the present disclosure is to provide a foldable display device including an adhesive layer having a high adhesiveness with the optical element and a releasing property.

Objects of the present disclosure are not limited to the above-mentioned objects, and other objects, which are not mentioned above, can be clearly understood by those skilled in the art from the following descriptions.

In order to solve the above-described problems, according to an aspect of the present disclosure, a foldable display device, includes: a panel assembly divided into a folding area and a non-folding area; and an optical element on the panel assembly, where the optical element includes zigzag grooves repeatedly patterned on an upper surface of the optical element.

In order to solve the above-described problems, according to an aspect of the present disclosure, a foldable display device includes: a panel assembly divided into a folding area and a non-folding area; a back plate supporting the panel assembly below the panel assembly; an optical element on the panel assembly; and an adhesive layer between the panel assembly and the optical element, where the optical element includes zigzag grooves repeatedly patterned on an upper surface of the optical element.

Other detailed matters of the exemplary embodiments are included in the detailed description and the drawings.

According to the present disclosure, the stress and the impact due to the folding may be minimized or reduced in a folding area to reduce the damage of the display panel.

According to the present disclosure, as another function, the display device is flexibly bendable and a scratch resistance, impact resistance, and optical transparency may be improved or ensured.

The effects according to the present disclosure are not limited to the contents exemplified above, and more various effects are included in the present specification.

BRIEF DESCRIPTION OF THE DRAWINGS

The above and other aspects, features, and other advantages of the present disclosure will be more clearly understood from the following detailed description taken in conjunction with the accompanying drawings.

FIG. 8 is a table for comparing characteristics in accordance with a tensile elastic modulus and a thickness of an optical element according to various embodiments of the present disclosure.

FIG. 9 is a table for comparing characteristics in accordance with a thickness of an adhesive layer according to various embodiments of the present disclosure.

DETAILED DESCRIPTION

Figure 1:
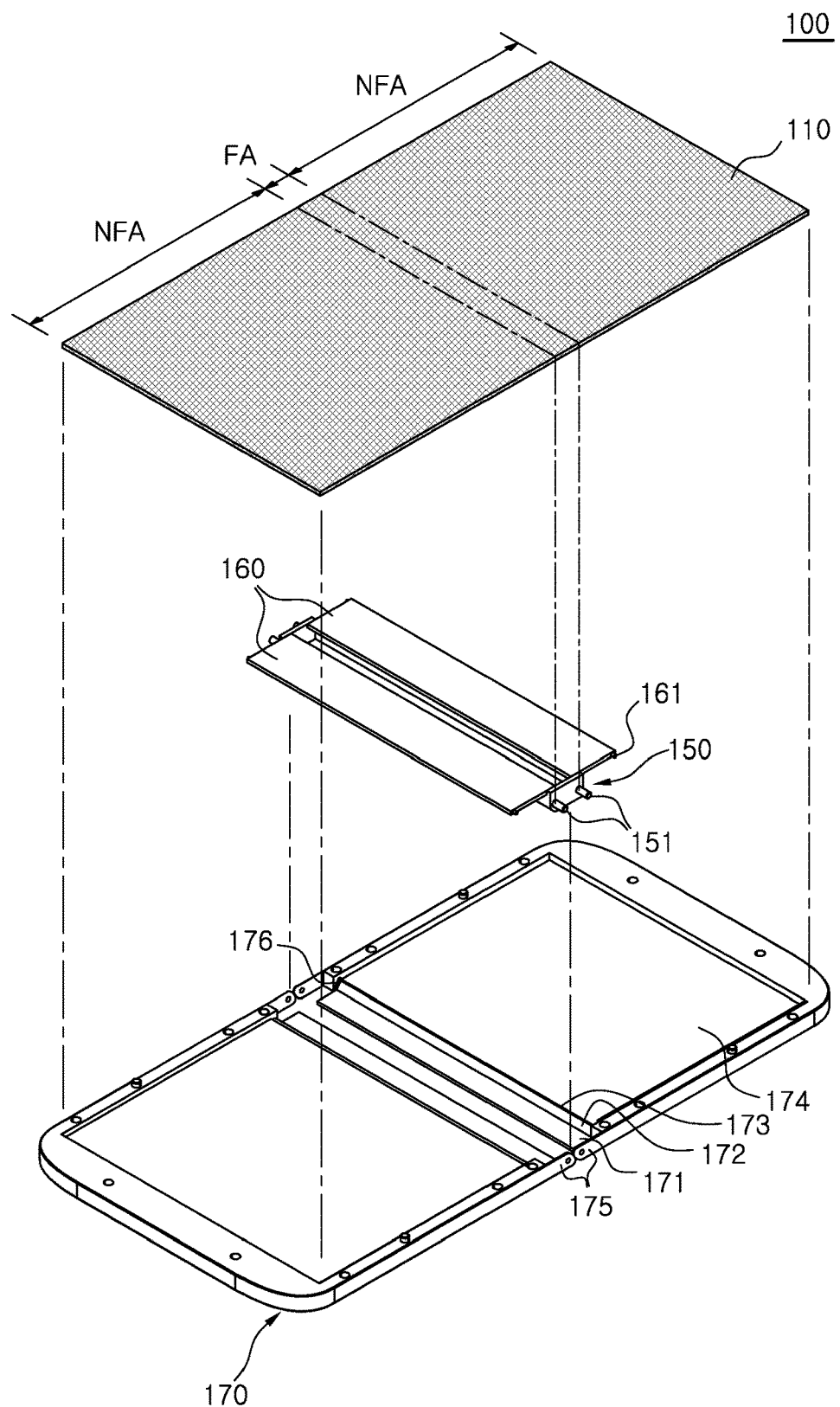
FIG. 1 is an exploded perspective view of a foldable display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but may be implemented in various forms. The exemplary embodiments are provided by way of example so that those skilled in the art can fully understand the disclosures of the present disclosure and the scope of the present disclosure. Therefore, the present disclosure will be defined by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated. The figures may not necessarily be drawn to scale.

The features of various embodiments of the present disclosure can be partially or entirely adhered to or combined with each other and can be interlocked and operated in technically various ways, and the embodiments can be carried out independently of or in association with each other.

Hereafter, various embodiments of the present disclosure will be described in detail with reference to the accompanying drawings.

FIG. 1 is an exploded perspective view of a foldable display device according to an embodiment of the present disclosure.

Figure 2A:
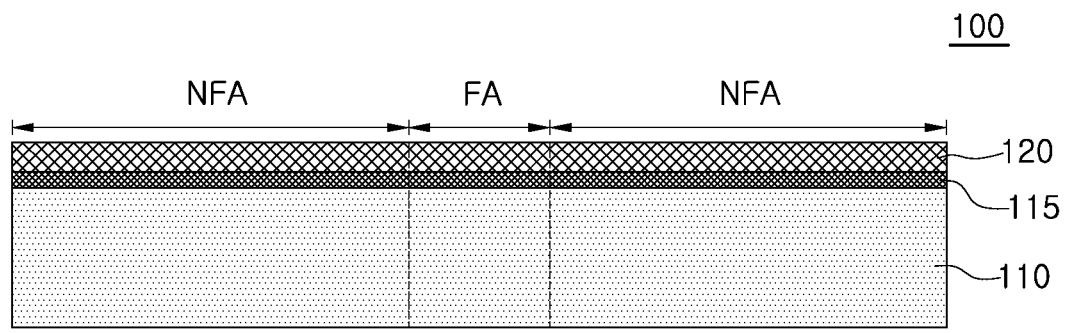
FIGS. 2A and 2B are cross-sectional views of a panel assembly of a foldable display device according to the embodiment of the present disclosure illustrated in FIG. 1.
Figure 2B:
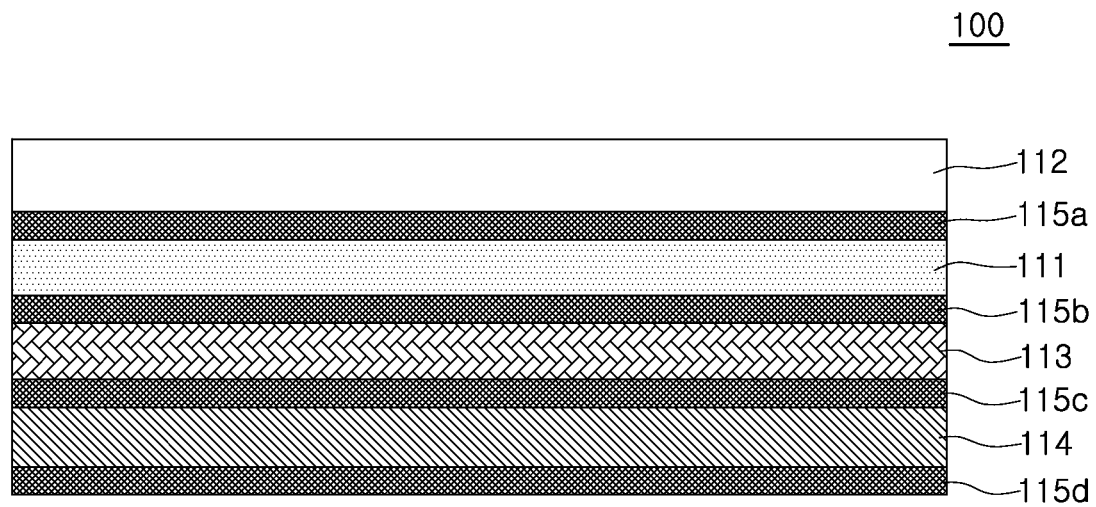

FIGS. 2A and 2B are cross-sectional views of a panel assembly of a foldable display device according to the embodiment of the present disclosure illustrated in FIG. 1.

In this case, FIG. 2B illustrates a cross-sectional structure of a panel assembly 110 and FIG. 2A illustrates that an optical element 120 is additionally provided above the panel assembly 110 illustrated in FIG. 2B. The optical element 120 may be provided above the panel assembly 110 with an adhesive layer 115 therebetween.

Referring to FIGS. 1, 2A, and 2B, a foldable display device 100 according to an embodiment of the present disclosure may include a panel assembly 110, a set frame 170, a hinge unit 150, an adjustable supporting unit 160, and an optical element 120.

The panel assembly 110 may include a display panel 111 to display images.

In the display panel 111, a display element for displaying images and a circuit, wiring line, components, and the like for driving the display element may be disposed.

A predetermined optical element 120 may be additionally attached above the panel assembly 110 with the adhesive layer 115 therebetween.

The panel assembly 110 may be divided into a folding area FA and a non-folding area NFA, which may include one or more non-folding areas separated by a folding area as shown in FIG. 2A.

The folding area FA is an area where the panel assembly 110 can be folded. When the foldable display device 100 is unfolded, the folding area FA may be maintained to be flat, and when the foldable display device 100 is folded, the folding area FA may be folded or bent.

The non-folding area NFA is an area where the panel assembly 110 is maintained to be a flat (e.g., unbent) state in both the unfolded state and the folded state of the panel assembly 110. The non-folding areas NFA can be connected to opposite sides of the folding area FA and may rotate (e.g., about a folding axis) as the folding area FA is folded. The non-folding area NFA may be on a same plane as the folding area FA in the unfolded state and the non-folding areas NFA may be opposite to each other in the folded state. In the folded state, a first non-folding area NFA may overlap or cover a second non-folding area NFA.

The set frame 170 is disposed below the panel assembly 110 to support at least a part of the panel assembly 110. Specifically, the non-folding area NFA of the panel assembly 110 may be supported on an inner surface of the set frame 170.

Among the surfaces forming the inner surfaces of the set frame 170, a lower surface of the set frame 170 in contact with a lower surface of the panel assembly 110 may be formed by a first lower surface 171, an inclined surface 172, a seating surface 173, and a second lower surface 174.

Specifically, the second lower surface 174 supports the non-folding area NFA of the panel assembly 110 and the inner surface may be formed to be thinnest on the second lower surface 174 among the lower surfaces of the set frame 170 (e.g., the first lower surface 171, inclined surface 172, seating surface 173, and second lower surface 174). An adhesive material is applied between the second lower surface 174 and the non-folding area NFA of the panel assembly 110 to fix the panel assembly 110 to the set frame 170.

The seating surface 173 is a surface on which an end portion of the adjustable supporting unit 160 is seated in the unfolded state of the foldable display device 100, and the adjustable supporting unit 160 may be hung on the seating surface 173. In this case, the seating surface 173 has a step lower than the second lower surface 174 so that an end portion of the adjustable supporting unit 160 does not move to the second lower surface 174. In this case, a thickness of the step between the seating surface 173 and the second lower surface 174 may be the same as the thickness of the adjustable supporting unit 160.

The inclined surface 172 connects the seating surface 173 to the first lower surface 171 and may form an inclination relative to the first lower surface 171 and the second lower surface 174.

Among the lower surfaces of the set frame 170, the inner surface is formed to be deepest on the first lower surface 171. Among the lower surfaces of the set frame 170, the first lower surface 171 is the closest to the hinge unit 150. When the foldable display device 100 is folded, the first lower surface 171 may be in contact with the adjustable supporting unit 160.

First hinge coupling units 175 that extend to the hinge unit 150 are provided at both ends of one end portion of the set frame 170 at a side of the hinge unit 150. The first hinge coupling unit 175 may be hinged to a first hinge shaft 151 of the hinge unit 150 and the set frame 170 may rotate about the first hinge shaft 151, but is not limited thereto.

A recessed portion may be defined in the set frame 170 by the first lower surface 171, the inclined surface 172, an outer surface of the hinge unit 150, and the first hinge coupling unit 175. The recessed portion is an area that is recessed from the inner surface of the set frame 170 adjacent to the hinge unit 150. That is, the recessed portion is an empty space formed by the inner surface of the set frame 170, which is adjacent to the hinge unit 150 and retreated from the hinge unit 150. The recessed portion is an empty space between the first lower surface 171, the inclined surface 172, and the hinge unit 150 and in the unfolded state, the adjustable supporting unit 160 may be disposed above the recessed portion, but is not limited thereto.

A guide groove 176 may be disposed on an inner surface of the set frame 170. That is, the guide groove 176 is disposed on a guide surface at a side of the first hinge coupling unit 175 on the inner surface of the set frame 170. On the guide surface, the guide groove 176 may be disposed to be adjacent to a boundary of the guide surface, the seating surface 173, the inclined surface 172, and the first lower surface 171, but is not limited thereto.

Even though not illustrated in the drawing, the guide surface is one of the side surfaces of the inner surface of the set frame 170 and is a side connected from both ends of the end portion of the set frame 170 at the side of the hinge unit 150 to the first hinge coupling unit 175. Therefore, the guide surface may be disposed to be perpendicular to the first lower surface 171.

The guide groove 176 may coincide with a rotation trajectory of the end portion of the adjustable supporting unit 160 so that the adjustable supporting unit 160 does not deviate during the rotation. Specifically, for example, a protruding portion 161 of the adjustable supporting unit 160 may be fitted to the guide groove 176 and the adjustable supporting unit 160 may be slidably guided along the guide groove 176 when the foldable display device 100 is switched between the folded state and the unfolded state. Therefore, in the unfolded state, one end of the guide groove 176 is adjacent to the seating surface 173 on which the end portion of the adjustable supporting unit 160 is disposed, and in the folded state, the other end of the guide groove 176 may be adjacent to the first lower surface 171 on which the end portion of the adjustable supporting unit 160 is disposed.

The adjustable supporting unit 160 is disposed below the panel assembly 110 to support the panel assembly 110 together with the set frame 170. Specifically, for example, the adjustable supporting unit 160 may support the folding area FA of the panel assembly 110. In the unfolded state, one pair of adjustable supporting units 160 and one pair of set frames 170 form one plane (e.g., the pair of adjustable supporting units 160 are on a same plane as the pair of set frames 170). In the folded state, the adjustable supporting unit 160 may retreat toward the inner surface of the set frame 170. That is, in the folded state, the adjustable supporting unit 160 rotates toward the lower surface of the set frame 170 to be in contact with the first lower surface 171 of the set frame 170. However, in contrast to the second lower surface 174 of the set frame 170, a separate adhesive material is not applied on the adjustable supporting unit 160 and the adjustable supporting unit 160 is not fixed to the panel assembly 110.

The adjustable supporting unit 160 may include a second hinge coupling unit (not illustrated) that extends from the lower surface of the adjustable supporting unit 160 to the hinge unit 150 at an arbitrary intermediate point between both end portions of the adjustable supporting unit 160. The second hinge coupling unit may provide additional mechanical support to the foldable display device 100.

The second hinge coupling unit may be rotatably coupled to a second hinge shaft (not illustrated) of the hinge unit 150. Therefore, the adjustable supporting unit 160 may rotate about the second hinge shaft on the second hinge shaft, and a rotation trajectory of both end portions of the adjustable supporting unit 160 may be determined with respect to the second hinge shaft.

The adjustable supporting unit 160 may include protruding portions 161 disposed at both ends of the end portion of the adjustable supporting unit 160 at a side of the set frame 170. The protruding portion 161 extends toward the guide surface of the set frame 170 to be fitted to the guide groove 176 of the guide surface. Therefore, when the adjustable supporting unit 160 rotates about the second hinge shaft, the protruding portion 161 may slide along the guide groove 176.

The hinge unit 150 is disposed below the panel assembly 110 to be hinged to one pair of set frames 170 and one pair of adjustable supporting units 160. Therefore, one pair of set frames 170 and one pair of adjustable supporting units 160 may rotate about the hinge unit 150. The hinge unit 150 is disposed below the folding area FA of the panel assembly 110 and includes one pair of first hinge shafts 151 and one pair of second hinge shafts, but is not limited thereto. The folding area FA may have a width corresponding (e.g., equal) to a width of the hinge unit 150.

The first hinge shafts 151 protrude from outer surfaces of both ends of the hinge unit 150 to be coupled to the first hinge coupling unit 175 of the set frame 170. In this case, one pair of the first hinge shafts 151 is coupled to one pair of set frames 170, respectively. For example, one of the first hinge shafts 151 is coupled to one pair of first hinge coupling units 175 in the set frame 170 disposed on one side of the hinge unit 150 and the other first hinge shaft 151 is coupled to one pair of first hinge coupling units 175 in the set frame 170 disposed on the other side of the hinge unit 150. Therefore, the foldable display device 100 according to the embodiment shown in FIG. 1 may be implemented by a biaxial hinge structure, but it is not limited thereto. Other embodiments may include a different number or arrangement of hinges to facilitate folding or bending of the foldable display device 100.

The second hinge shaft protrudes from inner surfaces at both ends of the hinge unit 150 to be coupled to the second hinge coupling unit of the adjustable supporting unit 160. In this case, the second hinge shafts are coupled to one pair of adjustable supporting units 160. For example, one second hinge shaft is coupled to the second hinge coupling unit of the adjustable supporting unit 160 disposed at one side of the hinge unit 150 and the other second hinge shaft is coupled to the second hinge coupling unit of the adjustable supporting unit 160 disposed at the other side of the hinge unit 150.

The foldable display device 100 according to an embodiment of the present disclosure is a display device in which a display element, a circuit, and the like are formed on a flexible substrate. Therefore, even though the foldable display device is bendable or foldable, images can be displayed in a folded state, an unfolded state, or while bending between the folded state and the unfolded state. The foldable display device 100 may be switched between an unfolded state in which the foldable display device 100 is unfolded to be flat and a folded state in which the upper surfaces of the foldable display device 100 are folded to be in contact with each other.

Hereinafter, the panel assembly 110 will be described in more detail.

Referring to FIG. 2B, the panel assembly 110 according to an embodiment of the present disclosure may include a display panel 111, a back plate 113, a frame 114, a cover window 112, and a plurality of adhesive layers 115a, 115b, 115c, and 115d.

As described above, the display panel 111 may be divided into an active area and a non-active area as well as a folding area FA and a non-folding area NFA. The active area and/or the non-active area may overlap with at least a part of the folding area FA and/or the non-folding area NFA.

The active area is an area where images are displayed and a plurality of pixels may be disposed.

In the active area, a display element for displaying images and a circuit unit for driving the display element may be disposed. For example, when the foldable display device 100 is an organic light emitting display device, the display element may include an organic light emitting diode.

Hereinafter, for the convenience of description, it is assumed that the display device according to various exemplary embodiments of the present disclosure is a foldable display device 100 including an organic light emitting diode, but is not limited thereto.

The circuit units may include various thin film transistors, capacitors, wiring lines, and the like for driving the organic light emitting diode. For example, the circuit units may include various components such as a driving thin film transistor, a switching thin film transistor, a storage capacitor, a gate line, and a data line, but are not limited thereto.

The non-active area is an area where images are not displayed but a circuit, a wiring line, a component, and the like for driving the display element of the active area are disposed.

In the non-active area, various ICs such as a gate driver IC and a data driver IC and driving circuits may be disposed. For example, various ICs and the driving circuit may be mounted in the non-active area of the display panel 111 by a gate in panel (GIP) or connected to the display panel 111 by a tape carrier package (TCP) or a chip on film (COF) manner.

The folding area FA is an area where the panel assembly 110 is folded and may overlap with or include at least a part of the active area and at least a part of the non-active area.

Further, in the non-folding area NFA, the panel assembly 111 maintains a flat state.

The non-folding area NFA may extend to opposite sides of the folding area FA. That is, one pair of non-folding areas NFA may be defined with the folding area FA therebetween. Further, when the panel assembly 110 is folded, one pair of non-folding areas NFA may be disposed to be opposite to each other, e.g., overlapping or covering at least a portion of each other.

The back plate 113 may be disposed below the display panel 111.

When a substrate included in the display panel 111 is formed of a plastic material such as polyimide (PI), the manufacturing process of the foldable display device 100 is performed in a situation that the support substrate formed of glass is disposed below the substrate. Further, after forming components such as a polarizing plate or a touch panel on the display panel 111, the support substrate may be released. However, since a component for supporting the substrate is necessary even after releasing the support substrate, a back plate 113 formed of a metal foil for supporting the substrate may be disposed below the substrate. The back plate 113 may protect the display panel 111 from moisture or other contaminants, heat, impact or other mechanical damage, and the like from the outside.

The frame 114 may be disposed below the back plate 113. The frame 114 may protect the back plate 113 and the display panel 111 above the frame 114.

In some embodiments, a plurality of frames 114 may be provided.

The frame 114 may be disposed in the non-folding area NFA excluding the folding area FA. Since the frame 114 is not disposed in the folding area FA, the frame 114 is not folded and is not applied with the stress due to the folding.

Though not illustrated in FIG. 2B, a polarizing plate may be disposed above the display panel 111.

The polarizing plate selectively transmits light to reduce the reflection of external light incident onto the display panel 111. Specifically, the display panel 111 may include various metal materials applied to the thin film transistor, the wiring line, the organic light emitting diode, and the like. Therefore, the external light incident onto the display panel 111 may be reflected from the metal material so that the visibility of the foldable display device 100 may be reduced due to the reflection of the external light. Therefore, when the polarizing plate is disposed, the polarizing plate suppresses the reflection of the external light to increase the outdoor visibility of the foldable display device 100. However, the polarizing plate may be omitted in some embodiments depending on an implementation of the foldable display device 100.

Further, even though not illustrated in FIG. 2B, a touch panel may be further disposed between the polarizing plate and the display panel 111. The touch panel is a device that senses a screen touch on the foldable display device 100 or a touch input of the user such as a gesture and may be a resistive type, a capacitive type, an optical type, or an electromagnetic type.

The cover window 112 may be disposed above the polarizing plate.

The cover window 112 may protect the polarizing plate and the display panel 111 below the cover window 112 from the impact or other mechanical damage, the moisture or other contaminants, heat, and the like from the outside. The cover window 112 may be formed of a glass.

The adhesive layers 115a, 115b, 115c, and 115d are disposed between the above-described components to be used to bond a component with another component. The adhesive layers 115a, 115b, 115c, and 115d may be disposed between the cover window 112 and the display panel 111, between the display panel 111 and the back plate 113, between the back plate 113 and the frame 114, and between the frame 114 and another layer, respectively. For example, the adhesive layers 115a, 115b, 115c, and 115d may be formed of an optical clear adhesive (OCA) or a pressure sensitive adhesive (PSA), but is not limited thereto.

The foldable display device 100 according to an embodiment of the present disclosure may be in-folded and/or out-folded. When the foldable display device 100 is in-folded, the foldable display device 100 may be folded such that upper surfaces of the frame 114 are opposite to each other at both sides. In other words, the foldable display device 100 may be folded such that upper surfaces of the optical element 120 are opposite to each other at both sides.

When the foldable display device 100 is out-folded, the foldable display device 100 may be folded such that lower surfaces of the frame 114 are opposite to each other at both sides.

When the foldable display device 100 configured as described above is an organic light emitting display device, the display panel 111 may be an organic light emitting display panel.

Even though not illustrated, the organic light emitting display panel may include an organic light emitting diode disposed on the substrate, a capping layer disposed on the organic light emitting diode, a protective layer disposed on the capping layer, and an encapsulating layer disposed on the protective layer.

The organic light emitting diode may be formed on one surface of the substrate for each unit pixel. The organic light emitting diode may include a first electrode supplied with a current from the driving transistor, a second electrode corresponding to the first electrode, and a light emitting layer disposed between the first electrode and the second electrode.

The first electrode may be provided as a transparent electrode or a reflective electrode.

When the first electrode is configured as a transparent electrode, the first electrode may be formed of ITO, IZO, ZnO, or $In_2O_3$. When the first electrode is configured as a reflective electrode, the first electrode may include a reflective film formed of Ag, Mg, Al, Pt, Pd, Au, Ni, Nd, Ir, Cr, or a compound thereof and a transparent film formed of ITO, IZO, ZnO, or $In_2O_3$ thereon.

The light emitting layer may include a red light emitting layer, a green light emitting layer, and a blue light emitting layer. In another embodiment, the light emitting layer may include a white light emitting layer and separately include color filters of red, green, and blue.

In addition to the light emitting layer, at least one of a hole injection layer, a hole transport layer, an electron transport layer, and an electron injection layer may be further provided between the first electrode and the second electrode. The light emitting layer, the hole injection layer, the hole transport layer, the electron transport layer, and the electron injection layer are also referred to as organic layers. The organic layer may be formed of a low molecular organic material or a high molecular organic material.

The second electrode may be formed of a material generally used in the art. The second electrode may also be provided as a transparent electrode or a reflective electrode.

When the second electrode is provided as a transparent electrode, the second electrode may include a film formed of Li, Ca, LiF/Ca, LiF/Al, Al, Mg, or a compound thereof and a film formed of a material for forming a transparent electrode such as ITO, IZO, ZnO, or $In_2O_3$ thereon. When the second electrode is provided as a reflective electrode, the second electrode may be provided by depositing Li, Ca, LiF/Ca, LiF/Al, Al, Mg, or a compound thereto.

The capping layer may be further disposed between the second electrode and the protective layer.

The protective layer disposed on the capping layer may perform a function of protecting the encapsulating layer so that the side surface of the encapsulating layer is not peeled off or the uniformity is not affected during the manufacturing process of the encapsulating layer.

Further, the encapsulating layer may be disposed to protect the organic light emitting diode. The encapsulating layer may serve to block the permeation of oxygen or moisture into the organic light emitting diode. The encapsulating layer disposed on the protective layer may include metal oxide.

The encapsulating layer may be formed using metal oxide, for example, a material selected from calcium oxide, alumina, silica, titania, indium oxide, tin oxide, and silicon oxide, but the material is not necessarily limited to the above examples.

A predetermined optical element 120 is attached above the panel assembly 110 configured as described above, with the adhesive layer 115 therebetween. When the cover window 112 of a foldable display device 100 is formed of a glass, an optical element 120 can protect a user from scattering of fragments due to external impact or stress. Further, it is advantageous to have a replaceable adhesive layer 115 having high adhesiveness between the optical element 120 and the cover window 112. Embodiments of a foldable display device 100 including an optical element 120 having various functions and an adhesive layer 115 having a high adhesiveness and a releasing property without increasing an overall thickness is advantageous and provides a solution of the above-described problem.

Figure 3A:
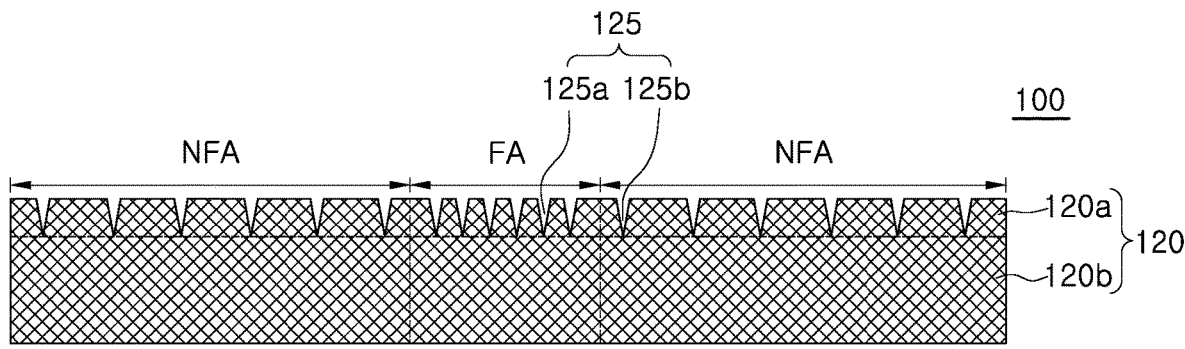
FIGS. 3A and 3B are a cross-sectional view and a plan view, respectively, illustrating an optical element in a foldable display device according to an embodiment of the present disclosure.
Figure 3B:
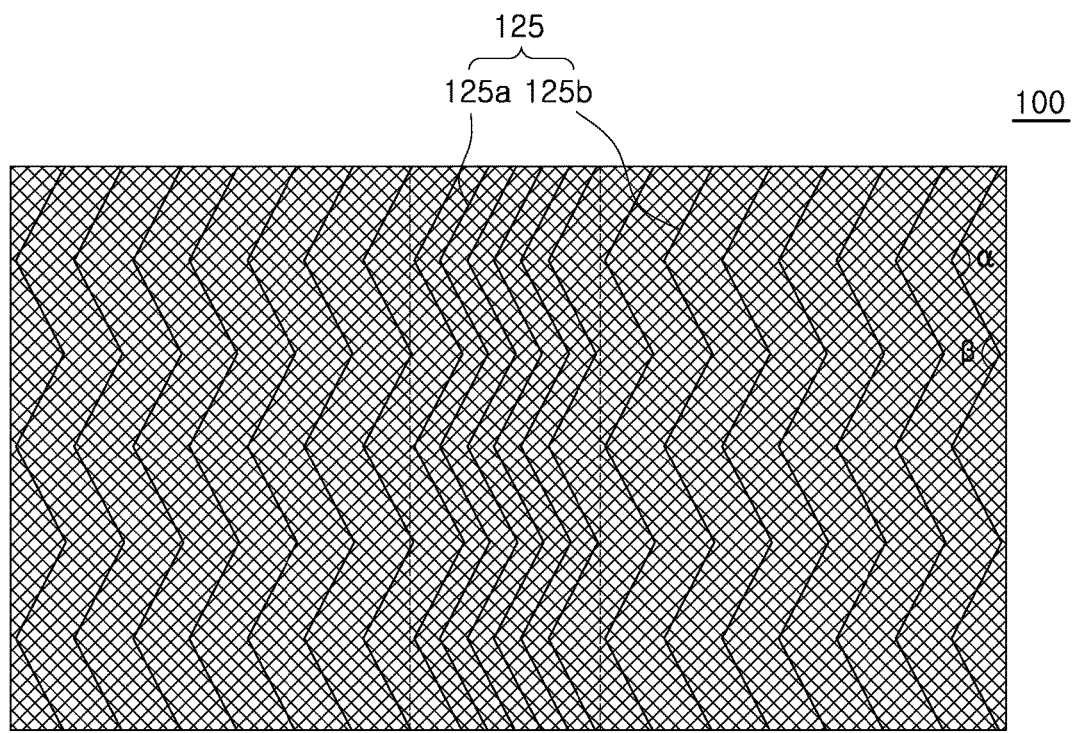

FIGS. 3A and 3B are a cross-sectional view and a plan view, respectively, illustrating an optical element in a foldable display device according to an embodiment of the present disclosure.

Referring to FIGS. 3A and 3B, the optical element 120 of an embodiment of the present disclosure may be a protective film having a low elastic modulus to protect the panel assembly 110 and may be disposed on an uppermost or outermost portion of the panel assembly 110. In this case, the adhesive layer 115 has a high adhesiveness to suppress delamination from an anti-finger (AF) processed surface. Therefore, according to an embodiment of the present disclosure, the foldability may be facilitated or ensured.

For the optical element 120, it is advantageous for a polymer film to have an impact resistance, a scratch resistance, a foldability, and a transparency that is not accompanied with a significant increase of modulus due to the surface treatment such as hard coating (HC) or anti-finger process (AF).

The tensile elastic modulus of the polymer film to be used may be approximately 0.8 to 4.5 GPa. If the tensile elastic modulus is lower than 0.8 GPa, the rigidity of the film itself is insufficient, so that the impact absorbing ability against the external impact is greatly deteriorated. If the tensile elastic modulus is greater than 4.5 GPa, the foldability is significantly lowered. A thickness of the polymer film may be approximately 70 to 125 μm. If the thickness is 70 μm or smaller, the rigidity of the film itself is insufficient, so that the impact absorbing ability against the external impact is greatly deteriorated. If the thickness is 125 μm or greater, the foldability is significantly lowered.

The thickness and the hardness of the HC are appropriately 2 to 3 μm and 2 H, respectively.

Further, the adhesive layer 115 should decouple the stress between the optical element 120 and the cover window 112 and have high adhesiveness and high transparency.

In order to compensate a reduced surface energy due to a surface treatment of the HC or AF, a high adhesiveness of 200 to 500 gf/in is required. When the adhesiveness is 500 gf/in or lower, the peeling-off is generated due to the folding and when the adhesiveness is 500 gf/in or greater, the encapsulating layer EL is peeled off.

In the optical element 120 according to the embodiment shown in FIGS. 3A-B, zigzag grooves 125 are repeatedly patterned on a surface of the upper portion 120a with a predetermined depth. The zigzag grooves 125 may include straight segments connected at corners (e.g., as shown in FIG. 3B) or curves (e.g., having a sinusoidal shape). At least a first part of the grooves may be in a first direction and at least a second part of the grooves may be in a second direction different than the first direction. A pattern of the grooves 125 may be repeated a constant period or interval (e.g., distance between grooves), or at a variable period or interval, for example, gradually increasing or decreasing. The depth of each groove may be a portion of a thickness of the optical element 120. Therefore, the optical element 120 may include a lower portion 120b serving as a base and an upper portion 120a in which the grooves 125 are patterned above the lower portion 120b.

The groove 125 may be patterned in a direction (a vertical direction in FIG. 3B) perpendicular to or intersecting a folding direction (a horizontal direction in FIG. 3B) of the panel assembly 110. The groove 125 may be patterned in the same direction as a folding axis of the panel assembly 110.

The groove 125 may have a shape selected from a triangular wave shape, a sine wave shape, and a pulsed wave shape, among other types of shapes.

The groove 125 may include a plurality of first grooves 125a patterned in the folding area FA and a plurality of second grooves 125b patterned in the non-folding area NFA, but is not limited thereto. In some embodiments, the groove 125 may be patterned in a zigzag form in the folding area FA and not in the non-folding area NFA.

The plurality of first grooves 125a may be more densely patterned than the plurality of second grooves 125b. That is, according to an embodiment of the present disclosure, a pattern interval between the plurality of first grooves 125a in the folding area FA is smaller than a pattern interval between the plurality of second grooves 125b in the non-folding area NFA. Therefore, the stress due to the folding in the folding area FA may be minimized or reduced. Since a pattern interval between the plurality of second grooves 125b in the non-folding area NFA is larger than a pattern interval between the plurality of first grooves 125a in the folding area NFA, the rigidity in the non-folding direction may be maintained.

The groove 125 may be patterned with a thickness that is 10% to 20% of the entire thickness of the optical element 120. That is, a thickness of the upper portion 120a of the optical element 120 with the patterned groove 125 is smaller than a thickness of the lower portion 120b of the optical element 120 in which the groove 125 is not patterned. Further, the upper portion has a thickness that is 10% to 20% of the entire thickness of the optical element 120 so that the stress due to the folding may be minimized or reduced and the damage due to physical impact may be minimized or reduced.

The plurality of first grooves 125a according to an embodiment of the present disclosure may be patterned on the upper surface of the optical element 120 with a constant interval, but is not limited thereto.

In order to impart flexibility to the folding direction, the zigzag shaped groove 125 may have a predetermined pitch angle ($\alpha$, $\beta$) (e.g., where $0<\alpha<180$ degrees and $0<\beta<180$ degrees). However, for smaller values of $\alpha$ and $\beta$, the grooves may be more densely patterned.

In some embodiments, the groove 125 may be patterned with a round wavy shape (having curves), rather than a zigzag pattern (having straight segments connected at corners).

The left and the right sides of the groove 125 may be symmetrical with respect to the center of the folding area FA, but are not limited thereto and may be asymmetrical.

As described above, the optical element 120 of an embodiment of the present disclosure may be a protective film protecting the panel assembly 110 and an additional layer may be further provided thereon.

Figure 4:
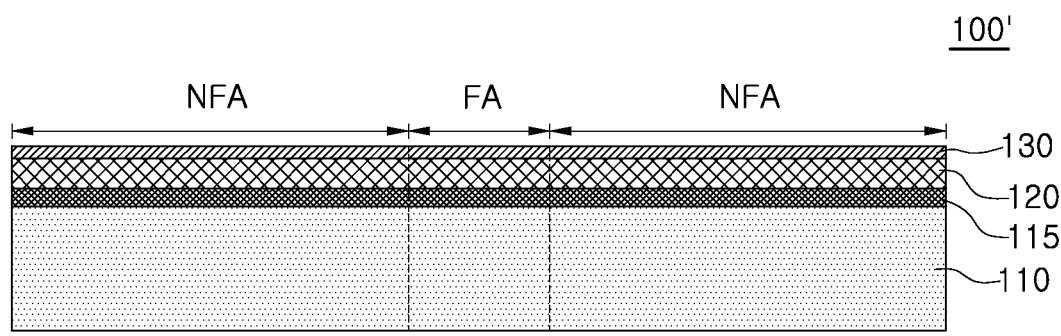
FIG. 4 is a cross-sectional view illustrating a foldable display device according to an embodiment of the present disclosure.

FIG. 4 is a cross-sectional view illustrating a foldable display device according to an embodiment of the present disclosure.

The foldable display device 100' illustrated in FIG. 4 may substantially have the same configuration as the foldable display device 100 according to the embodiment shown in FIGS. 1 and 2A-B, except that a hard coating HC, anti-finger AF, or UV blocking functional layer 130 is added on the optical element 120 of the protective film. Therefore, a description of the same configuration will be omitted for purposes of clarity.

Referring to FIG. 4, according to the present disclosure, a hard coating HC, anti-finger AF, or UV blocking functional layer 130 may be added on the optical element 120 of the protective film. A hard coating HC functional layer 130 may be added for an impact resistance, and an anti-finger AF functional layer 130 may be added for a wear resistance.

In this case, an adhesive layer 115 having a low storage elastic modulus is introduced to compensate for an increased folding stress.

As illustrated in FIG. 4, the functional layer 130 is disposed at the uppermost portion of the panel assembly 110, rather than the optical element 120, so that zigzag grooves are not patterned on the upper surface of the optical element 120, but the aforementioned zigzag grooves may be patterned on the upper surface of the functional layer 130. The shape and the characteristic of the grooves are as described above.

Figure 5:
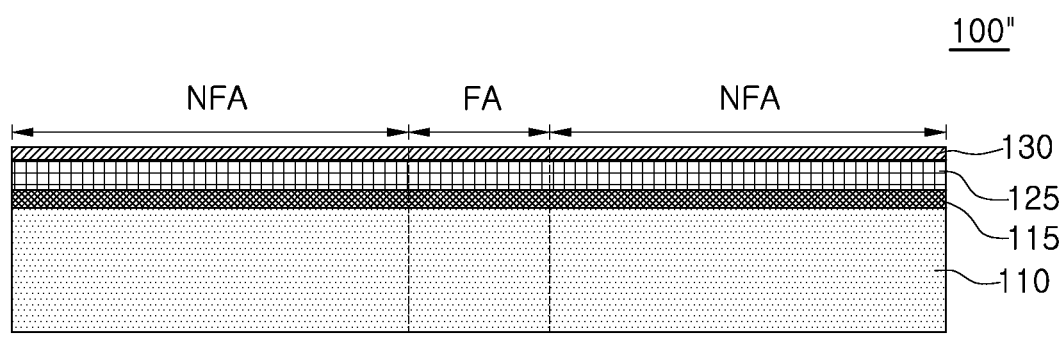
FIG. 5 is a cross-sectional view illustrating another foldable display device according to an embodiment of the present disclosure.

FIG. 5 is a cross-sectional view illustrating another foldable display device according to an embodiment of the present disclosure.

The foldable display device 100" illustrated in FIG. 5 may substantially have the same configuration as the foldable display device 100 according to the embodiment shown in FIGS. 1 and 2A-B, except that a hard coating HC, anti-finger AF, or UV blocking functional layer 130 is added on an optical element 125 of a mura-free protective film. Therefore, a description of the same configuration will be omitted for purposes of clarity.

Referring to FIG. 5, according to the present disclosure, a hard coating HC, anti-finger AF, or UV blocking functional layer 130 may be added on the optical element 125 of the mura-free protective film. A hard coating HC functional layer 130 may be added for an impact resistance, and an anti-finger AF functional layer 130 may be added for a wear resistance.

In this case, the adhesive layer 115 having a high creep and recovery rate is introduced to compensate for a folding stress.

As illustrated in FIG. 5, the functional layer 130 is disposed at the uppermost portion of the panel assembly 110, rather than the optical element 125, so that zigzag grooves are not patterned on the upper surface of the optical element 125, but the aforementioned zigzag grooves may be patterned on the upper surface of the functional layer 130. The shape and the characteristic of the grooves are as described above.

Figure 6:
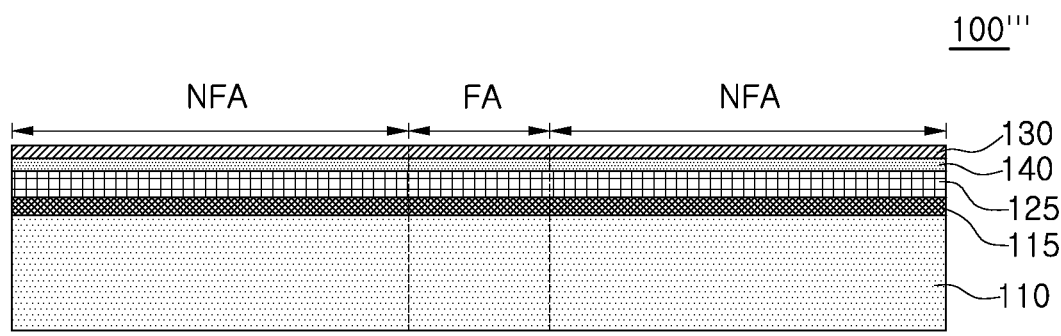
FIG. 6 is a cross-sectional view illustrating another foldable display device according to an embodiment of the present disclosure.

FIG. 6 is a cross-sectional view illustrating another a foldable display device according to an embodiment of the present disclosure.

The foldable display device 100" illustrated in FIG. 6 may substantially have the same configuration as the foldable display device 100 according to the embodiment shown in FIGS. 1 and 2A-B, except that a low refractive primer 140 and a hard coating HC, anti-finger AF, or UV blocking functional layer 130 are added on an optical element 125 of a protective film. Therefore, a description of the same configuration will be omitted for purposes of clarity.

Referring to FIG. 6, according to the present disclosure, a low refractive primer 140 for improving an optical characteristic and a hard coating HC, anti-finger AF, or UV blocking functional layer 130 may be added on the optical element 125 of the protective film. The primer 140 may be added to improve the optical characteristic of rainbow mura-free. Further, a hard coating HC functional layer 130 may be added for an impact resistance, and an anti-finger AF functional layer 130 may be added for a wear resistance.

In this case, the adhesive layer 115 having a high creep and recovery rate is introduced to compensate for a folding stress. Further, material or manufacturing costs of the display device may be reduced as compared with the mura-free protective film.

As illustrated in FIG. 6, the functional layer 130 is disposed at the uppermost portion of the panel assembly 110, rather than the optical element 125, so that zigzag grooves are not patterned on the upper surface of the optical element 125, but the aforementioned zigzag grooves may be patterned on the upper surface of the functional layer 130. The shape and the characteristic of the grooves are as described above.

The adhesive layer 115 according to an embodiment of the present disclosure has a high adhesiveness to suppress the separation from the anti-finger AF processed surface. The adhesive layer 115 may include a silicon optical clear adhesive (OCA) or an acryl OCA having a storage modulus of approximately $10^4$ to $10^5$ Pa. In this case, the folding separation is not generated, a stress relaxation is 90% or greater, and a creep and recovery rate is 90% or greater.

For the purpose of relaxation of the stress of the entire panel assembly 110 due to the folding, the adhesive layer 115 according to an embodiment of the present disclosure has a low modulus and a high adhesiveness. In contrast to the OCA of the related art, in an optical temperature range of −30 to 100 degrees Celsius, the foldable OCA should be gently maintained without causing a sharp gradient of the modulus. This is because the sharp modulus increase should be minimized or reduced at a low temperature, and process issues caused due to the reduction of the modulus should be minimized or reduced at a room temperature and a high temperature.

Figure 7:
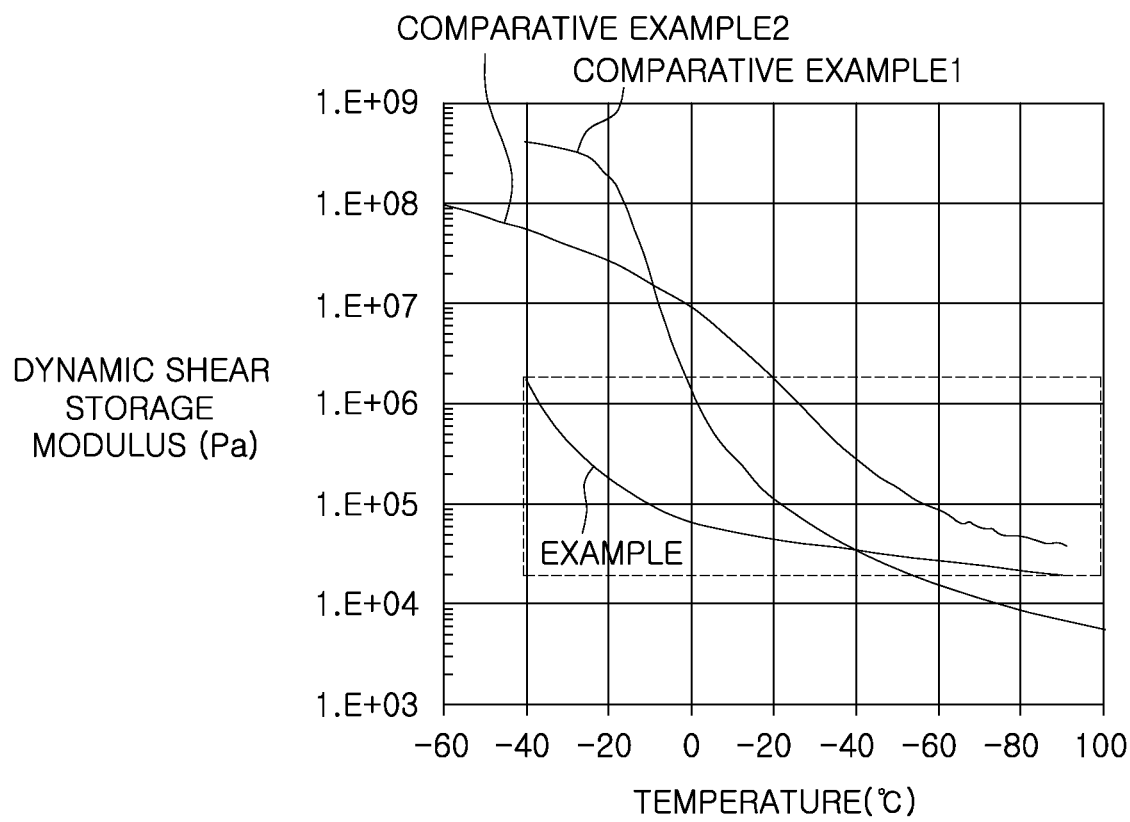
FIG. 7 is a graph of dynamic shear storage modulus of an adhesive layer in accordance with an embodiment of the present disclosure.

FIG. 7 is a graph of dynamic shear storage modulus of an adhesive layer in accordance with an embodiment of the present disclosure. The graph includes curves showing how a dynamic shear storage modulus of a certain material varies based on temperature of the material.

In FIG. 7, a first comparative example 1 illustrates a curve of an acryl OCA of the related art and a second comparative example 2 illustrates a curve of a silicon OCA of the related art. Further, a dotted line rectangular box includes a curve of a shear storage modulus of the foldable OCA (e.g., a silicon OCA having a low modulus relative to the first and second comparative examples) according to an embodiment.

Referring to FIG. 7, in order to relieve a stress of the entire panel assembly due to the folding, the adhesive layer according to an embodiment may have a low modulus and a high adhesiveness.

In some embodiments, a flexible storage modulus (G') at which the tension and shear deformation behavior by the folding is allowed is approximately $10^5$ Pa.

It is advantageous for a level of G' for maintaining an adhesiveness to be maintained at approximately $1.4 \times 10^5$ Pa at −20 degrees, approximately $9 \times 10^4$ Pa at 25 degrees, and approximately $9.3 \times 10^4$ Pa at 60 degrees.

Further, the deformation and recovery behavior of the OCA for the tensile deformation and the shear deformation of the cover window and the protective film due to the repeated folding is important.

In an embodiment, when a stress of 10 KPa is applied for 10 minutes, at a room temperature, a creep amount may be 100% or greater, and a recovery rate may be 92% or greater. When the creep amount is less than 90%, the folding stress is transmitted to the lower structure to cause crack or encapsulating layer EL separation.

FIG. 8 is a table for comparing characteristics in accordance with a tensile elastic modulus and a thickness of an optical element according to various embodiments of the present disclosure.

FIG. 8 compares results of an optical transparency, a foldability, a hard coating HC crack, and an impact resistance when tensile elastic moduli of the protective film as the optical element are 0.5, 0.8, 4.5, and 6.5 GPa and thicknesses of the protective film are 75, 100, and 125 μm. In this case, the thickness of the OCA serving as an adhesive layer is 25 μm.

Referring to FIG. 8, it is understood that when a tensile elastic modulus of a polymer film used as a protective film is 0.8 to 4.5 GPa, the optical transparency, the foldability, the hard coating HC crack resistance, and the impact resistance are excellent (corresponding to columns 1 to 6 of the table shown in FIG. 8).

It is understood that if the tensile elastic modulus is 0.8 GPa or lower, for example, if the tensile elastic modulus is 0.5 GPa, the rigidity of the film itself is insufficient regardless of the film thickness so that an impact absorbing ability of a steel ball or a pen metal tip against the external impact may be significantly deteriorated. For example, the distances in the ball-drop and pen-drop tests decrease from a range of 5-17 cm (corresponding to columns 1-6 of the table shown in FIG. 8) to a range of 1-2 cm (corresponding to columns 7 to 9 of the table shown in FIG. 8).

It is understood that if the tensile elastic modulus is 4.5 GPa or greater, for example, if the tensile elastic modulus is 6.5 GPa, the foldability is significantly lowered regardless of the film thickness. For example, the number of folds at room temperature decreases from 50K (corresponding to columns 1-6 of the table shown in FIG. 8) to 5-10K (corresponding to columns 10 to 12 of the table shown in FIG. 8).

Further, the appropriate film thickness is 70 to 125 µm and when the film thickness is 70 µm or smaller and 125 µm or larger, the result is substantially the same as the above-described result of the tensile elastic modulus. That is, the impact absorbing ability and foldability may deteriorate for a film having thickness that is less than 70 µm or greater than 125 µm.

As described above, in examples corresponding to columns 1 to 6 of the table shown in FIG. 8, the hard coating HC crack, the high temperature dynamic foldability, and the high temperature and humidity static foldability are improved as compared with the examples corresponding to columns 7 to 12.

FIG. 9 is a table for comparing characteristics in accordance with a thickness of an adhesive layer according to various embodiments of the present disclosure.

FIG. 9 compares a result of the foldability, the indentation, the hard coating HC crack, and the impact resistance when the adhesiveness of the OCA serving as an adhesive layer is 20 to 30 gf/in and a thickness is 10, 15, 20, 25, 30, 35, 40, 45, and 50 µm. In this case, the tensile elastic modulus and the thickness of the polymer film as a protective film are 4.5 GPa and 125 µm, respectively.

It is advantageous to decouple the stress between the cover window and the protective film and have high adhesiveness and high transparency for the adhesive layer.

As described above, in order to compensate for a reduced surface energy due to a surface treatment for hard coating HC or anti-finger AF, a high adhesiveness of 200 to 500 gf/in is required. If the adhesiveness is 200 gf/in or lower, the peeling-off is generated due to the folding and if the adhesiveness is 500 gf/in or greater, the encapsulating layer EL is prone to be peeled off.

It is understood that when the thickness of the OCA is 25 to 40 µm, the foldability, the indentation, the hard coating HC crack, and the impact resistance are excellent (corresponding to columns 1 to 4 of the table shown in FIG. 9).

If the thickness of the OCA is 25 µm or smaller, for example, if the thickness of the OCA is 10, 15, and 20 µm, a foldability and an impact absorbing ability of a steel ball or a pen metal tip against the external impact may be significantly weakened. For example, the distances in the pen-drop tests decrease from a range of 13-18 cm (corresponding to columns 1-4 of the table shown in FIG. 9) to a range of 10-11 cm (corresponding to columns 5 and 6 of the table shown in FIG. 9).

It is understood that if the thickness of the OCA is 40 µm or larger, for example, if the thickness of the OCA is 45, or 50 µm, an indentation failure occurs (corresponding to columns 8 and 9 of the table shown in FIG. 9). However, an indentation failure does not occur when the thickness of the OCA is 10 to 40 µm (corresponding to columns 1 through 7 of the table shown in FIG. 9).

In some embodiments, the pattern of the groove may not be formed in the non-folding area. In this case, the rigidity gradient of the folding area and the non-folding area is maintained and the rigidity lowering phenomenon due to the groove may be mitigated or compensated. This will be described in detail below.

Figure 10A:
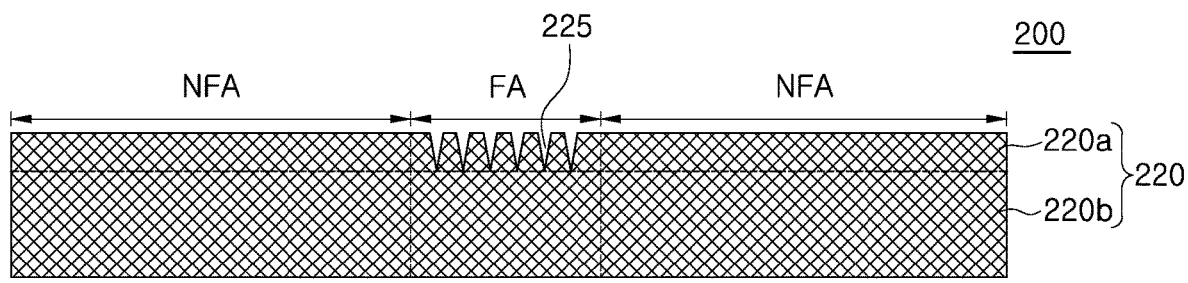
FIGS. 10A and 10B are a cross-sectional view and a plan view, respectively, illustrating an optical element in a foldable display device according to an embodiment of the present disclosure.
Figure 10B:
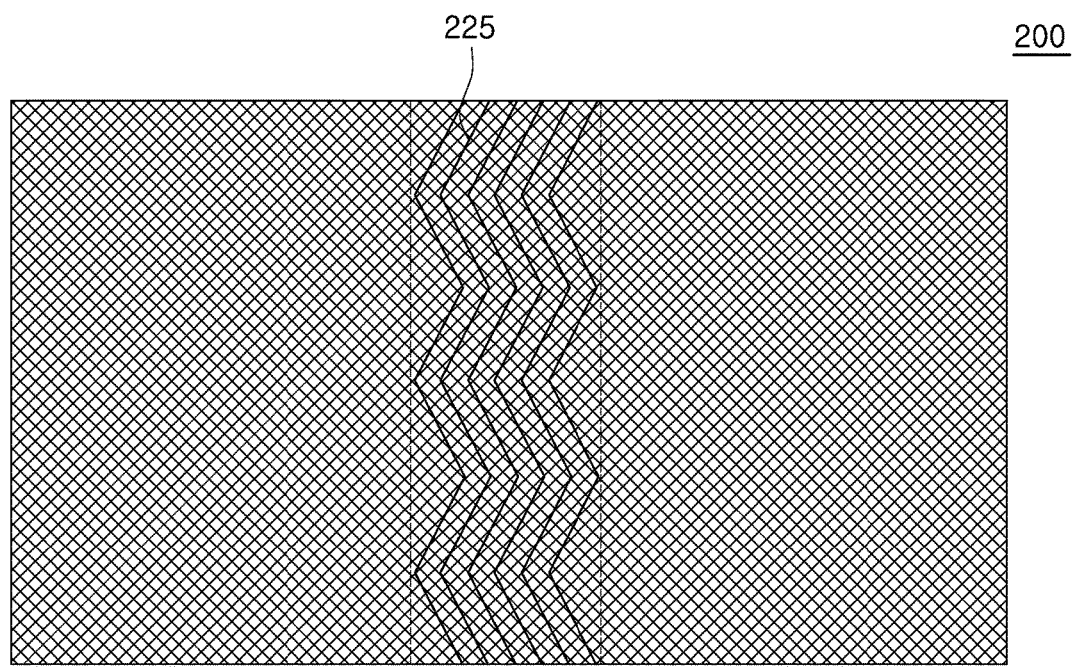

FIGS. 10A and 10B are a cross-sectional view and a plan view, respectively, illustrating an optical element in a foldable display device according to an embodiment of the present disclosure.

Referring to FIGS. 10A and 10B, a foldable display device 200 according to an embodiment of the present disclosure may include a panel assembly divided into a folding area FA and a non-folding area NFA and an optical element 220 above the panel assembly.

The optical element 220 of the embodiment shown in FIG. 10A-B may be a protective film having a low elastic modulus to protect the panel assembly and may be disposed on an uppermost portion of the panel assembly. In this case, similar to the above-described embodiments of the present disclosure, the adhesive layer has a high adhesiveness to suppress the separation from the anti-finger AF processed surface. Therefore, the foldability of the foldable display device 200 may be facilitated or ensured.

As the optical element 220, it is advantageous for the polymer film to have an impact resistance, a scratch resistance, a foldability, and a transparency. Additionally, the polymer film should not result in a significant increase of modulus due to the surface treatment such as hard coating (HC) or anti-finger (AF) process.

The tensile elastic modulus of the polymer film to be used may be approximately 0.8 to 4.5 GPa. If the tensile elastic modulus is 0.8 GPa or lower, the rigidity of the film itself is insufficient, so that the impact absorbing ability against external impact is greatly deteriorated, and if the tensile elastic modulus is 4.5 GPa or greater, the foldability is significantly lowered. An appropriate thickness of the film may be approximately 70 to 125 µm. If the thickness is 70 µm or smaller, the rigidity of the film itself is insufficient, so that the impact absorbing ability against external impact is greatly deteriorated, and if the thickness is 125 µm or larger, the foldability is significantly lowered.

The thickness and the hardness of a hard coating HC layer may be appropriately 2 to 3 µm and 2H, respectively.

Further, the adhesive layer should decouple the stress between the optical element 220 and the cover window and have high adhesiveness and high transparency.

In order to compensate for a reduced surface energy due to a surface treatment of the hard coating HC or anti-finger AF, a high adhesiveness of 200 to 500 gf/in may be required. When the adhesiveness is 500 gf/in or lower, the peeling-off is generated due to the folding and when the adhesiveness is 500 gf/in or greater, the encapsulating layer EL is prone to be peeled off.

In the optical element 220 according to the embodiment shown in FIGS. 10A-B, zigzag grooves 225 are repeatedly patterned on a surface of the upper portion 220a with a predetermined depth. Therefore, the optical element 220 may include a lower portion 220b serving as a base and an upper portion 220a in which the groove 225 is patterned above the lower portion 220b.

The groove 225 may be patterned in a direction (a vertical direction in FIG. 10B) perpendicular to or intersecting a folding direction (a horizontal direction in FIG. 10B) of the panel assembly. The groove 225 may be patterned in the same direction as a folding axis of the panel assembly.

The groove 225 may have a shape selected from a triangular wave shape, a sine wave shape, and a pulsed wave shape, among other types of shapes.

According to the embodiment shown in FIGS. 10A-10B, a plurality of grooves may be patterned only in the folding area FA. That is, the grooves are not patterned in the non-folding area NFA.

The plurality of grooves 225 may be patterned with a thickness that is 10% to 20% of the entire thickness of the optical element 220. That is, a thickness of the upper portion 220a of the optical element 220 with the plurality of patterned grooves 225 is smaller than a thickness of the lower portion 220b of the optical element 220 in which the plurality of grooves 225 is not patterned. Further, the upper portion has a thickness that is 10% to 20% of the entire thickness of the optical element 220 so that the stress due to the folding may be minimized or reduced and the damage due to the impact may be minimized or reduced.

Further, the plurality of grooves 225 may be patterned on the upper surface of the optical element 220 only in the folding area FA with a constant interval, but is not limited thereto.

In some embodiments, the plurality of grooves 225 may be patterned not with a zigzag pattern (having straight segments connected at corners), but with a round wavy shape (having curves).

The left and the right sides of the plurality of grooves 225 may be symmetrical with respect to the center of the folding area FA, but are not limited thereto and may be asymmetrical.

Substantially similar to the above-described embodiments of the present disclosure, the optical element 220 may be a protective film protecting the panel assembly and an additional layer may be further provided thereon.

The rigid gradient of the folding area FA and the non-folding area NFA is maintained and the rigidity lowering phenomenon due to the groove 225 may be compensated. Further, excessive deformation of the hinge unit due to increase of resistance for the torsional stress may be suppressed.

Figure 11A:
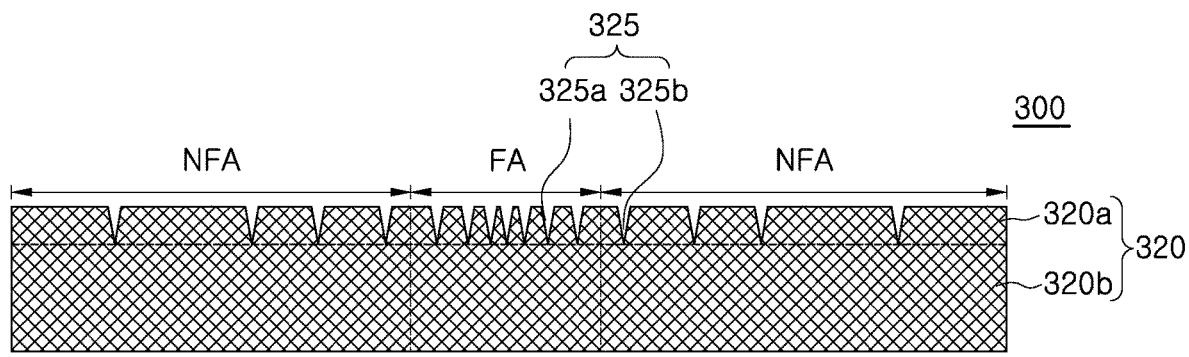
FIGS. 11A and 11B are a cross-sectional view and a plan view, respectively, illustrating an optical element in a foldable display device according to an embodiment of the present disclosure.
Figure 11B:
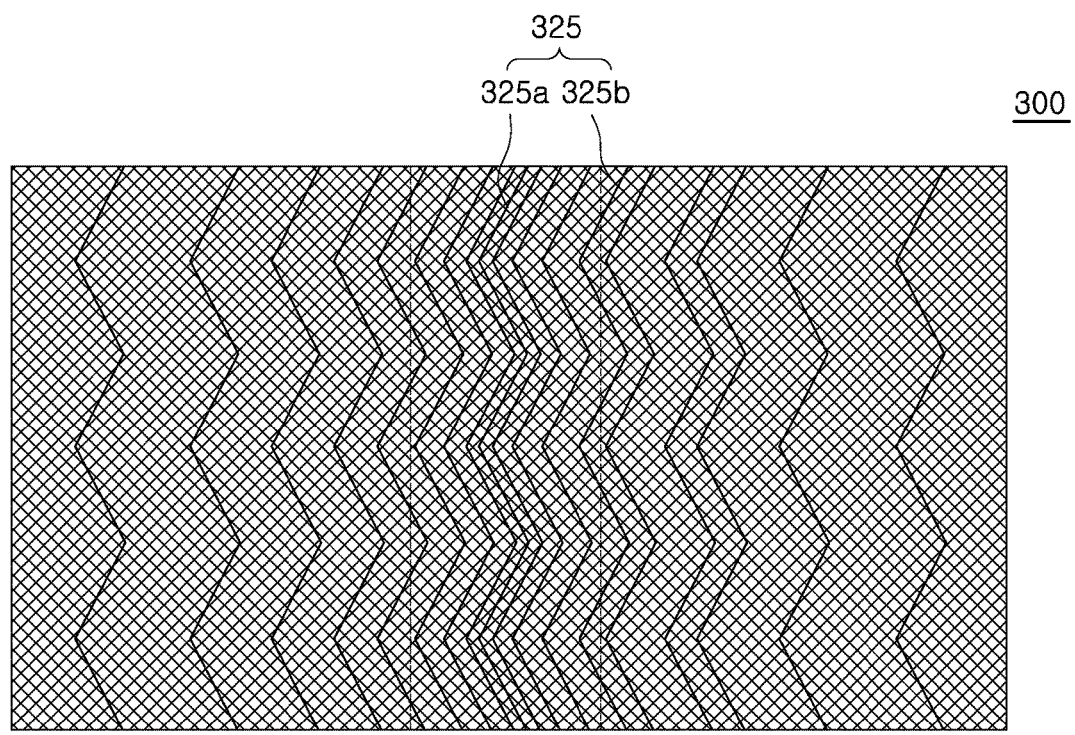

FIGS. 11A and 11B are a cross-sectional view and a plan view, respectively, illustrating an optical element in a foldable display device according to an embodiment of the present disclosure.

Referring to FIGS. 11A and 11B, a foldable display device 300 according to an embodiment of the present disclosure may include a panel assembly divided into a folding area FA and a non-folding area NFA and an optical element 320 above the panel assembly.

The optical element 320 of the embodiment shown in FIGS. 11A-11B may be a protective film having a low elastic modulus to protect the panel assembly and may be disposed on an uppermost portion of the panel assembly. However, the present disclosure is not limited thereto and the optical element 320 may be configured by a protective film protecting the panel assembly and an additional layer may be provided thereon.

In this case, except for the configuration of the optical element 320, the substantially same configuration as the foldable display devices 100 and 200 described above may be configured. Therefore, description of the same configuration will be omitted for purposes of clarity.

In the optical element 320 according to the embodiment shown in FIGS. 11A-11B, zigzag grooves 325 are repeatedly patterned on a surface of the upper portion 320a with a predetermined depth. Therefore, the optical element 320 may include a lower portion 320b serving as a base and an upper portion 320a in which the groove 325 is patterned above the lower portion 320b.

The groove 325 may be patterned in a direction (a vertical direction in FIG. 11B) perpendicular to or intersecting a folding direction (a horizontal direction in FIG. 11B) of the panel assembly. The groove 325 may be patterned in the same direction as a folding axis of the panel assembly.

The groove 325 may have a shape selected from a triangular wave shape, a sine wave shape, and a pulsed wave shape, among other types of shapes.

The groove 325 may include a plurality of first grooves 325a patterned in the folding area FA and a plurality of second grooves 325b patterned in the non-folding area NFA, but as described above, it is not limited thereto.

The plurality of first grooves 325a and the plurality of second grooves 325b may be more densely patterned in the folding area FA as compared with the non-folding area NFA. That is, according to an embodiment of the present disclosure, a pattern interval between the plurality of first grooves 325a in the folding area FA is smaller than a pattern interval between the plurality of second grooves 325b in the non-folding area NFA. Therefore, the stress due to the folding in the folding area FA may be minimized or reduced. Since a pattern interval between the plurality of second grooves 325b in the non-folding area NFA is larger than a pattern interval between the plurality of first grooves 325a in the folding area NFA, the rigidity in the non-folding direction may be maintained.

In an embodiment, the intervals of the plurality of first grooves 325a and the plurality of second grooves 325 are gradually widened from the center of the folding area FA to the edge of the non-folding area NFA.

The plurality of grooves 325 may be patterned with a thickness that is 10% to 20% of the entire thickness of the optical element 320. That is, a thickness of the upper portion 320a of the optical element 320 with the plurality of patterned grooves 325 is smaller than a thickness of the lower portion 320b of the optical element 320 in which the plurality of grooves 325 is not patterned. Further, the upper portion has a thickness that is 10% to 20% of the entire thickness of the optical element 320 so that the stress due to the folding may be minimized or reduced and the damage due to the impact may be minimized or reduced.

In some embodiments, the plurality of grooves 325 may be patterned not with a zigzag pattern (having straight segments connected at corners), but with a round wavy shape (having curves).

The left and the right sides of the plurality of grooves 325 may be symmetrical with respect to the center of the folding area FA, but are not limited thereto and may be asymmetrical.

Figure 12A:
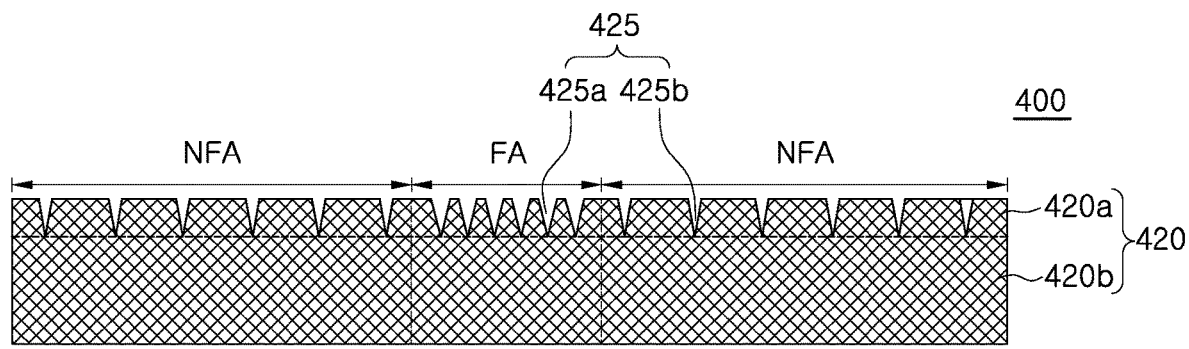
FIGS. 12A and 12B are a cross-sectional view and a plan view, respectively, illustrating an optical element in a foldable display device according to an embodiment of the present disclosure.
Figure 12B:
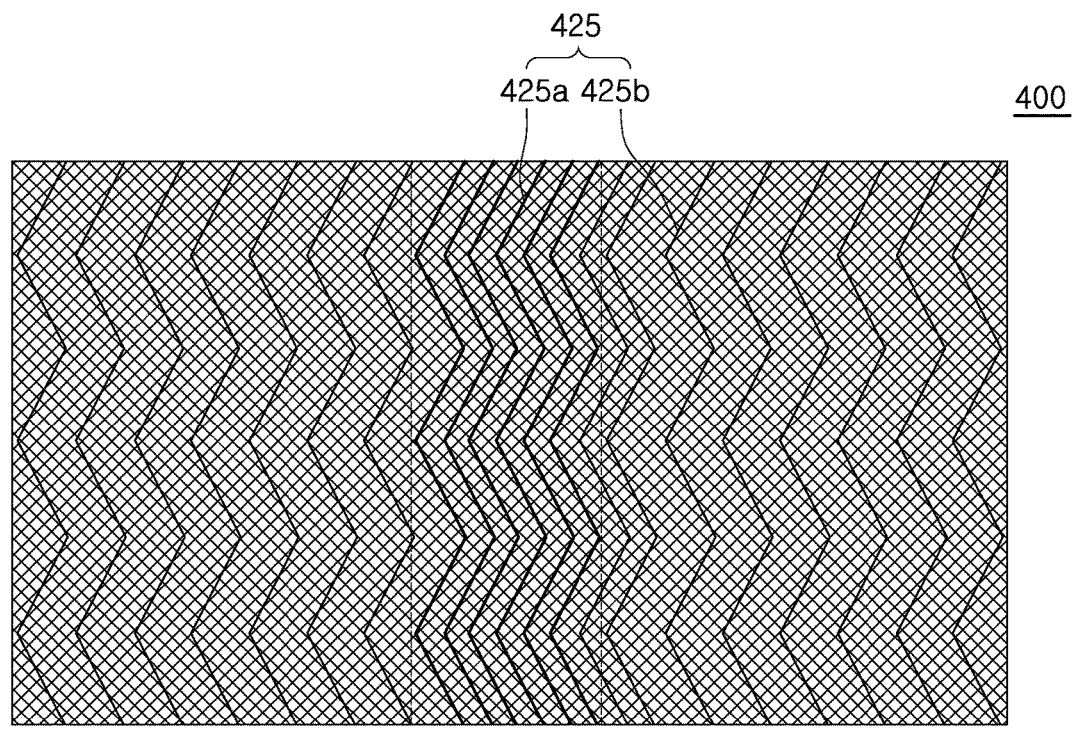

FIGS. 12A and 12B are a cross-sectional view and a plan view, respectively, illustrating an optical element in a foldable display device according to an embodiment of the present disclosure.

Referring to FIGS. 12A and 12B, a foldable display device 400 according to an embodiment of the present disclosure may include a panel assembly divided into a folding area FA and a non-folding area NFA and an optical element 420 above the panel assembly.

The optical element 420 of the embodiment shown in FIGS. 12A-12B may be a protective film having a low elastic modulus to protect the panel assembly and may be disposed on an uppermost portion of the panel assembly. However, the present disclosure is not limited thereto and the optical element 420 may be configured by a protective film protecting the panel assembly and an additional layer may be provided thereon.

In this case, except for the configuration of the optical element 420, the substantially same configuration as the foldable display devices 100, 200, and 300 described above may be configured. Therefore, a description of the same configuration will be omitted for purposes of clarity.

In the optical element 420 according to the embodiment shown in FIGS. 12A-B, zigzag grooves 425 are repeatedly patterned on a surface of the upper portion 420*a* with a predetermined depth. Therefore, the optical element 420 may include a lower portion 420*b* serving as a base and an upper portion 420*a* in which the groove 425 is patterned above the lower portion 420*b*.

The groove 425 may be patterned in a direction (a vertical direction in FIG. 12B) perpendicular to or intersecting a folding direction (a horizontal direction in FIG. 12B) of the panel assembly. The groove 425 may be patterned in the same direction as a folding axis of the panel assembly.

The groove 425 may have a shape selected from a triangular wave shape, a sine wave shape, and a pulsed wave shape, among other types of shapes.

The groove 425 may include a plurality of first grooves 425*a* patterned in the folding area FA and a plurality of second grooves 425*b* patterned in the non-folding area NFA, but as described above, it is not limited thereto.

The plurality of first grooves 425*a* may be more densely patterned than the plurality of second grooves 425*b*. That is, according to an embodiment of the present disclosure, a pattern interval between the plurality of first grooves 425*a* in the folding area FA is smaller than a pattern interval between the plurality of second grooves 425*b* in the non-folding area NFA. Therefore, the stress due to the folding in the folding area FA may be minimized or reduced. Since a pattern interval between the plurality of second grooves 425*b* in the non-folding area NFA is larger than a pattern interval between the plurality of first grooves 425*a* in the folding area NFA, the rigidity in the non-folding direction may be maintained.

In an embodiment, the plurality of first grooves 425*a* may be patterned to have a larger width than that of the plurality of second grooves 425*b*.

The plurality of grooves 425 may be patterned with a thickness that is 10% to 20% of the entire thickness of the optical element 420. Therefore, the stress due to the folding may be minimized or reduced and the damage due to the impact may be minimized or reduced.

In some embodiments, the plurality of grooves 425 may be patterned not with a zigzag pattern (having straight segments connected at corners), but with a round wavy shape (having curves).

The left and the right sides of the plurality of grooves 425 may be symmetrical with respect to the center of the folding area FA, but are not limited thereto and may be asymmetrical.

Figure 13A:
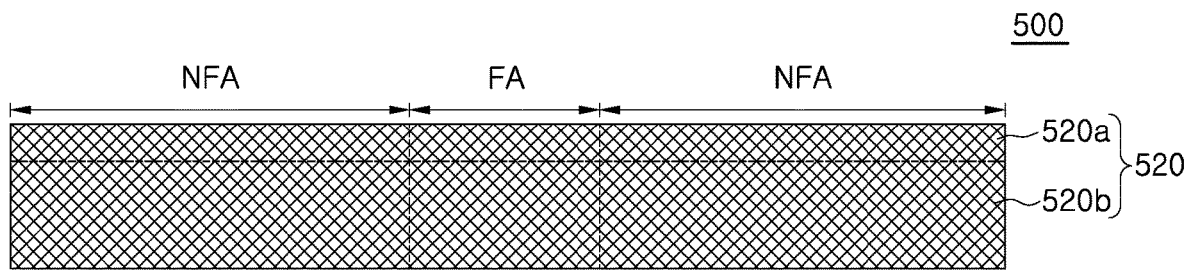
FIGS. 13A and 13B are a cross-sectional view and a plan view, respectively, illustrating an optical element in a foldable display device according to an embodiment of the present disclosure.
Figure 13B:
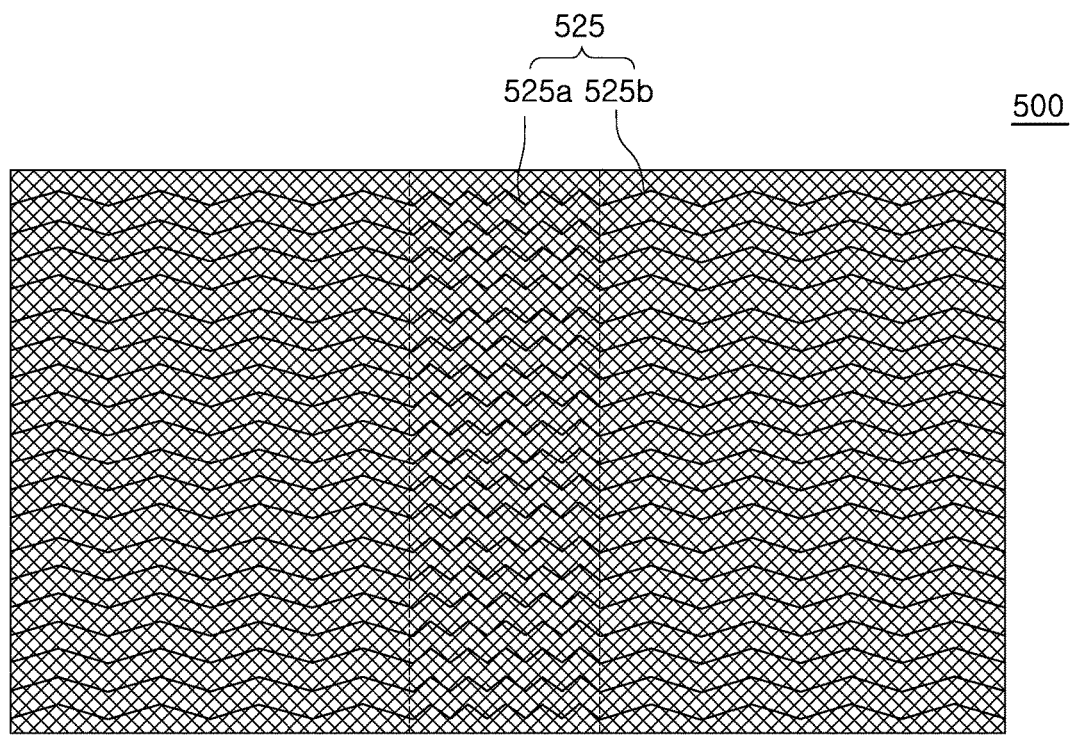

FIGS. 13A and 13B are a cross-sectional view and a plan view, respectively, illustrating an optical element in a foldable display device according to an embodiment of the present disclosure.

Referring to FIGS. 13A and 13B, a foldable display device 500 according to an embodiment of the present disclosure may include a panel assembly divided into a folding area FA and a non-folding area NFA and an optical element 520 above the panel assembly.

The optical element 520 of the embodiment shown in FIGS. 13A-13B may be a protective film having a low elastic modulus to protect the panel assembly and may be disposed on an uppermost portion of the panel assembly. However, the present disclosure is not limited thereto and the optical element 520 may be configured by a protective film protecting the panel assembly and an additional layer may be provided thereon.

In this case, except for the configuration of the optical element 520, the substantially same configuration as the foldable display devices 100, 200, 300, and 400 described above may be configured. Therefore, a description of the same configuration will be omitted for purposes of clarity.

In the optical element 520 according to the embodiment shown in FIGS. 13A-13B, zigzag grooves 525 are repeatedly patterned on a surface of the upper portion 520*a* with a predetermined depth. Therefore, the optical element 520 may include a lower portion 520*b* serving as a base and an upper portion 520*a* in which the groove 525 is patterned above the lower portion 520*b*.

The groove 525 may be patterned in a same direction as, or parallel to, a folding direction (a horizontal direction in FIG. 13B) of the panel assembly. The groove 525 may be patterned in a direction perpendicular to or intersecting a folding axis of the panel assembly.

The groove 525 may have a shape selected from a triangular wave shape, a sine wave shape, and a pulsed wave shape, among other types of shapes.

The plurality of grooves 525 patterned to be in a same direction as, or parallel to, the folding direction may include a first groove 525*a* patterned in the folding area FA and a second groove 525*b* patterned in the non-folding area NFA, respectively.

In this case, for each of the plurality of grooves 525, the zigzag pattern is more densely patterned in the folding area FA than in the non-folding area NFA. That is, according an embodiment of the present disclosure, a zigzag pattern of the first groove 525*a* in the folding area FA is more densely patterned than a zigzag pattern of the second groove 525*b* in the non-folding area NFA. Therefore, the stress due to the folding in the folding area FA may be minimized or reduced. Since a zigzag pattern of the second groove 525*b* in the non-folding area NFA is looser than a zigzag pattern of the first groove 525*a* in the folding area FA, the rigidity in the non-folding direction may be maintained.

The plurality of grooves 525 may be patterned with a thickness that is 10% to 20% of the entire thickness of the optical element 520. Therefore, the stress due to the folding may be minimized or reduced and the damage due to the impact may be minimized or reduced.

The plurality of grooves 525 may be patterned not with a zigzag pattern, but with a round wavy shape.

The left and the right sides of the plurality of grooves 525 may be symmetrical with respect to the center of the folding area FA, but are not limited thereto and may be asymmetrical.

The exemplary embodiments of the present disclosure can also be described as follows:

According to an aspect of the present disclosure, there is provided a foldable display device. The foldable display device includes a panel assembly divided into a folding area and a non-folding area and an optical element on the panel assembly, wherein the optical element includes grooves with a zigzag pattern repeatedly patterned on an upper surface of the optical pattern.

The foldable display device may include an adhesive layer between the panel assembly and the optical element.

The grooves may be patterned in a direction perpendicular to or intersecting a folding direction of the panel assembly.

The grooves may have a shape selected from a triangular wave shape, a sine wave shape, and a pulsed wave shape.

The grooves may include a plurality of first grooves patterned in the folding area and a plurality of second grooves patterned in the non-folding area.

The plurality of first grooves may be more densely patterned than the plurality of second grooves.

The grooves may be patterned to each have a depth of 10% to 20% of a thickness of the optical element.

The plurality of first grooves may be patterned on the upper surface of the optical element with a constant interval between grooves of the plurality of first grooves.

The grooves may be patterned only in the folding area.

The grooves may be more densely patterned in the folding area than in the non-folding area.

An interval between the grooves may be gradually widened from a center of the folding area to an edge of the non-folding area.

A first width of each groove of the plurality of first grooves may be greater than a second width of each groove of the plurality of second grooves.

The grooves may be patterned in a same direction as a folding direction of the panel assembly.

The zigzag pattern of the groove may be denser in the folding area than in the non-folding area.

The grooves may be patterned with the zigzag pattern only in the folding area.

According to another aspect of the present disclosure, there is provided a foldable display device. The foldable display device includes a panel assembly divided into a folding area and a non-folding area, a back plate supporting the panel assembly below the panel assembly, an optical element above the panel assembly and an adhesive layer between the panel assembly and the optical element, wherein the optical element includes grooves with a zigzag pattern repeatedly patterned on an upper surface of the optical element.

The grooves may include a plurality of first grooves patterned in the folding area and a plurality of second grooves patterned in the non-folding area, and the plurality of first grooves may be more densely patterned than the plurality of second grooves.

The grooves may be patterned only in the folding area.

An interval between the grooves may be gradually widened from a center of the folding area to an edge of the non-folding area.

In an embodiment, a foldable display device comprises: a panel assembly including: a folding area capable of being folded to a folded state of the foldable display device, and a display panel emitting light toward an upper surface of the panel assembly; and an optical element on the upper surface of the panel assembly, the optical element including grooves patterned on an upper surface of the optical element to facilitate folding of the folding area to the folded state, wherein at least a first part of the grooves is in a first direction and at least a second part of the grooves is in a second direction different than the first direction.

The panel assembly may further include a first non-folding area and a second non-folding area, wherein the folding area is between the first non-folding area and the second non-folding area.

The optical element may overlap at least a part of each of the folding area, the first non-folding area, and the second non-folding area.

An interval between the grooves may be gradually widened from a center of the folding area to an edge of the first non-folding area or the second non-folding area.

The grooves may include a plurality of first grooves patterned in the folding area and a plurality of second grooves patterned in the first non-folding area and the second non-folding area, wherein the plurality of first grooves is more densely patterned than is the plurality of second grooves.

The grooves may be patterned in a same direction as a folding axis of the panel assembly.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
   a panel assembly divided into a folding area and a non-folding area;
   a cover window on the panel assembly; and
   an optical element on the cover window,
   wherein the optical element includes grooves with a zigzag pattern repeatedly patterned on an upper surface of the optical element,
   wherein the upper surface of the optical element is an uppermost portion of the foldable display device.

2. The foldable display device according to claim 1, further comprising:
   an adhesive layer between the cover window and the optical element.

3. The foldable display device according to claim 1, wherein the grooves are patterned in a direction intersecting a folding direction of the panel assembly.

4. The foldable display device according to claim 3, wherein the grooves are patterned only in the direction intersecting the folding direction of the panel assembly.

5. The foldable display device according to claim 1, wherein the grooves have a shape selected from a triangular wave shape, a sine wave shape, and a pulsed wave shape.

6. The foldable display device according to claim 1, wherein the grooves include a plurality of first grooves patterned in the folding area and a plurality of second grooves patterned in the non-folding area.

7. The foldable display device according to claim 6, wherein the plurality of first grooves is more densely patterned than is the plurality of second grooves.

8. The foldable display device according to claim 6, wherein the plurality of first grooves is patterned on the upper surface of the optical element with a constant interval between grooves of the plurality of first grooves.

9. The foldable display device according to claim 6, wherein a first width of each groove of the plurality of first grooves is greater than a second width of each groove of the plurality of second grooves.

10. The foldable display device according to claim 1, wherein a depth of each of the grooves is 10% to 20% of a thickness of the optical element.

11. The foldable display device according to claim 1, wherein the grooves are patterned only in the folding area.

12. The foldable display device according to claim 1, wherein the grooves are more densely patterned in the folding area than in the non-folding area.

13. The foldable display device according to claim 1, wherein an interval between the grooves is gradually widened from a center of the folding area to an edge of the non-folding area.

14. The foldable display device according to claim 1, wherein the grooves are patterned in a same direction as a folding direction of the panel assembly.

15. The foldable display device according to claim 14, wherein the zigzag pattern of the grooves is denser in the folding area than in the non-folding area.

16. A foldable display device, comprising:
 a panel assembly divided into a folding area and a non-folding area;
 a back plate supporting the panel assembly below the panel assembly;
 a cover window on the panel assembly;
 an optical element on the cover window; and
 an adhesive layer between the cover window and the optical element,
 wherein the optical element includes grooves with a zigzag pattern repeatedly patterned on an upper surface of the optical element,
 wherein the upper surface of the optical element is an uppermost portion of the foldable display device.

17. The foldable display device according to claim 16, wherein the grooves include a plurality of first grooves patterned in the folding area and a plurality of second grooves patterned in the non-folding area, wherein the plurality of first grooves is more densely patterned than is the plurality of second grooves.

18. The foldable display device according to claim 17, wherein a first width of each groove of the plurality of first grooves is greater than a second width of each groove of the plurality of second grooves.

19. The foldable display device according to claim 16, wherein the grooves are patterned only in a direction intersecting the folding direction of the panel assembly.

20. The foldable display device according to claim 16, wherein an interval between the grooves is gradually widened from a center of the folding area to an edge of the non-folding area.

21. A foldable display device, comprising:
 a panel assembly including:
  a folding area capable of being folded to a folded state of the foldable display device, and
  a display panel emitting light toward an upper surface of the panel assembly;
 a cover window on the panel assembly; and
 an optical element on the upper surface of the cover window, the optical element including grooves patterned on an upper surface of the optical element to facilitate folding of the folding area to the folded state, wherein at least a first part of the grooves is in a first direction and at least a second part of the grooves is in a second direction different than the first direction,
 wherein the upper surface of the optical element is an uppermost portion of the foldable display device.

22. The foldable display device according to claim 21, wherein the panel assembly further includes:
 a first non-folding area and a second non-folding area, wherein the folding area is between the first non-folding area and the second non-folding area.

23. The foldable display device according to claim 22, wherein the optical element overlaps at least a part of each of the folding area, the first non-folding area, and the second non-folding area.

24. The foldable display device according to claim 22, wherein an interval between the grooves is gradually widened from a center of the folding area to an edge of the first non-folding area or the second non-folding area.

25. The foldable display device according to claim 22, wherein the grooves include a plurality of first grooves patterned in the folding area and a plurality of second grooves patterned in the first non-folding area and the second non-folding area, wherein the plurality of first grooves is more densely patterned than is the plurality of second grooves.

26. The foldable display device according to claim 21, wherein the grooves are patterned in a same direction as a folding axis of the panel assembly.

\* \* \* \* \*